US010089416B1

(12) United States Patent
DuBose et al.

(10) Patent No.: US 10,089,416 B1
(45) Date of Patent: Oct. 2, 2018

(54) SELF-SUPPORTING INTERNAL PASSAGEWAYS FOR POWDER METAL ADDITIVE MANUFACTURING

(71) Applicant: Stratasys, Inc., Eden Prairie, MN (US)

(72) Inventors: William Cody DuBose, Kyle, TX (US); Frederick Carl Claus, Phoenix, AZ (US); Andrew Carter, Austin, TX (US); Bryan Joshua Lee Bedal, Santa Clarita, CA (US)

(73) Assignee: Stratasys, Inc., Eden Prairie, MN (US)

( * ) Notice: Subject to any disclaimer, the term of this patent is extended or adjusted under 35 U.S.C. 154(b) by 634 days.

(21) Appl. No.: 14/656,329

(22) Filed: Mar. 12, 2015

(51) Int. Cl.
| | | |
|---|---|---|
| *G06F 17/50* | (2006.01) | |
| *G05B 15/02* | (2006.01) | |
| *B33Y 10/00* | (2015.01) | |
| *B33Y 30/00* | (2015.01) | |
| *B33Y 80/00* | (2015.01) | |
| *B33Y 50/02* | (2015.01) | |

(52) U.S. Cl.
CPC .............. *G06F 17/50* (2013.01); *G05B 15/02* (2013.01); *B33Y 10/00* (2014.12); *B33Y 30/00* (2014.12); *B33Y 50/02* (2014.12); *B33Y 80/00* (2014.12)

(58) Field of Classification Search
CPC . B29C 67/0077; B29C 67/0088; G05B 15/02; G06F 17/50; B33Y 10/00; B33Y 30/00; B33Y 50/02; B33Y 80/00
USPC ........................................................ 700/119
See application file for complete search history.

(56) References Cited

U.S. PATENT DOCUMENTS

| | | | |
|---|---|---|---|
| 2005/0166562 A1* | 8/2005 | Beall | B01D 46/247 55/523 |
| 2008/0296217 A1* | 12/2008 | Thoraval | B01D 63/066 210/484 |
| 2013/0310961 A1 | 11/2013 | Velez | |
| 2014/0052287 A1 | 2/2014 | Swanson et al. | |
| 2014/0255647 A1 | 9/2014 | Johnson et al. | |
| 2015/0087507 A1* | 3/2015 | Brew | B01J 35/04 502/439 |
| 2017/0232393 A1* | 8/2017 | Anquetil | B01D 63/066 210/407 |

OTHER PUBLICATIONS

Mumtaz, K. et al., "A Method to Eliminate Anchors/Supports From Directly Laser Melted Metal Powder Bed Processes," Additive Manufacturing Research Group, Loughborough Univeristy, Aug. 17, 2011, p. 55-64.

* cited by examiner

*Primary Examiner* — Kenneth M Lo
*Assistant Examiner* — Michael W Choi
(74) *Attorney, Agent, or Firm* — Peter J. Ims; Westman, Champlin & Koehler, P.A.

(57) ABSTRACT

An additive manufacturing process for building a three-dimensional part, which includes applying a layer of one or more powder-based metals onto or over a substrate, selectively melting and/or sintering the powder-based metals to produce a layer of the three-dimensional part, and repeating these steps such that the built three-dimensional part includes one or more self-supporting internal passageways, and which preferably precludes the need for internal support structures for the internal passageways.

10 Claims, 4 Drawing Sheets

SELF-SUPPORTING INTERNAL PASSAGEWAYS FOR POWDER METAL ADDITIVE MANUFACTURING

BACKGROUND

The present disclosure relates to additive manufacturing systems and processes for printing or otherwise building three-dimensional (3D) parts with layer-based, additive manufacturing techniques. In particular, the present disclosure relates to techniques for printing 3D parts having internal pathways using selective laser melting and/or direct metal laser sintering.

Additive manufacturing systems are used to print or otherwise build 3D parts from digital representations of the 3D parts (e.g., STL format files) using one or more additive manufacturing techniques. Examples of commercially available additive manufacturing techniques include extrusion-based techniques, jetting, selective laser sintering, powder/binder jetting, electron-beam melting, digital light processing, and stereolithographic processes. For each of these techniques, the digital representation of the 3D part is initially sliced into multiple horizontal layers. For each sliced layer, a tool path or image is then generated, which provides instructions for the particular additive manufacturing system to print the given layer.

For example, in an extrusion-based additive manufacturing system, a 3D part may be printed from a digital representation of the 3D part in a layer-by-layer manner by extruding a flowable part material. The part material is extruded through an extrusion tip carried by a print head of the system, and is deposited as a sequence of roads on a substrate in an x-y plane. The extruded part material fuses to previously deposited part material, and solidifies upon a drop in temperature. The position of the print head relative to the substrate is then incremented along a z-axis (perpendicular to the x-y plane), and the process is then repeated to form a 3D part resembling the digital representation.

In another example, in a stereolithography-based additive manufacturing system, a 3D part may be printed from a digital representation of the 3D part in a layer-by-layer manner by tracing a laser beam across a vat of photocurable resin. For each layer, the laser beam draws a cross-section for the layer on the surface of the liquid resin, which cures and solidifies the drawn pattern. After the layer is completed, the system's platform is lowered by a single layer increment. A fresh portion of the resin may then recoat the previous layer, and the laser beam may draw across the fresh resin to pattern the next layer, which joins the previous layer. This process may then be repeated for each successive layer. Afterwards, the uncured resin may be cleaned, and the resulting 3D part may undergo subsequent curing.

In fabricating 3D parts by these techniques, supporting layers or structures are typically built underneath overhanging portions or in cavities of 3D parts under construction, which are not supported by the part material itself. A support structure may be built utilizing the same techniques by which the 3D part is formed. The host computer generates additional geometry acting as a support structure for the overhanging or free-space segments of the 3D part being formed. The support structure adheres to the 3D part during fabrication, and is removable from the completed 3D part when the printing process is complete.

SUMMARY

An aspect of the present disclosure is directed to an additive manufacturing process for building a 3D printed part. The process includes applying a layer of one or more powder-based metals onto or over a substrate, performing a powder-based selective metal process (e.g., selectively melting and/or sintering the powder-based metals) based on a sliced layer of a digital model for the 3D printed part. These steps may be repeated for each layer of the 3D printed part to produce the 3D printed part having one or more self-supporting internal passageways, which preferably precludes the need for internal support structures for the internal passageways.

In some preferred embodiments, each internal passageway preferably has a tear-drop design with a downward-facing surface having a fillet radius within a first dimensional range (e.g., from about 0.005 inches to about 0.04 inches). Each internal passageway also preferably has a maximum lateral span within a second dimensional range (e.g., from about 0.25 inches or less, and more preferably from about 0.15 inches to about 0.25 inches).

In some further preferred embodiments, the 3D printed part includes two internal passageways separated by a tree structure rib. Additionally, the produced 3D printed part may be a valve body (e.g., a hydraulic manifold), a heat exchanger component (e.g., tubing), and/or any other suitable hollow part having organically-shaped internal passageways.

In another aspect, the present disclosure is directed to a method for producing a 3D printed part, which includes receiving to a computer a digital model of a 3D part to be printed using a powder-based selective metal process. The method also includes processing the digital model to generate one or more internal passageways each having a downward-facing surface with a fillet radius ranging from about 0.005 inches to about 0.04 inches, and where each internal passageway has a maximum lateral span of about 0.25 inches or less. The method further includes slicing the digital model having the one or more generated internal passageways with the computer into a plurality of sliced layers, and generating tool paths from the sliced layers for producing the three-dimensional printed part using the powder-based selective metal process. In some embodiments, the method also includes producing the 3D printed part using the powder-based selective metal process in an additive manufacturing system.

DEFINITIONS

Unless otherwise specified, the following terms as used herein have the meanings provided below:

The term "additive manufacturing system" refers to a system that prints, builds, or otherwise produces 3D parts and/or support structures at least in part using an additive manufacturing technique. The additive manufacturing system may be a stand-alone unit, a sub-unit of a larger system or production line, and/or may include other non-additive manufacturing features, such as subtractive-manufacturing features, pick-and-place features, two-dimensional printing features, and the like.

The term "providing", such as for "providing a device", when recited in the claims, is not intended to require any particular delivery or receipt of the provided item. Rather, the term "providing" is merely used to recite items that will be referred to in subsequent elements of the claim(s), for purposes of clarity and ease of readability.

The terms "preferred" and "preferably" refer to embodiments of the invention that may afford certain benefits, under certain circumstances. However, other embodiments may also be preferred, under the same or other circumstances.

Furthermore, the recitation of one or more preferred embodiments does not imply that other embodiments are not useful, and is not intended to exclude other embodiments from the scope of the present disclosure.

The terms "about" and "substantially" are used herein with respect to measurable values and ranges due to expected variations known to those skilled in the art (e.g., limitations and variabilities in measurements).

DETAILED DESCRIPTION

The present disclosure is directed to an additive manufacturing process for printing 3D parts having self-supporting internal passageways (e.g., flow paths, tunnels, and the like) using selective laser melting (SLM), and may also be utilized with direct metal laser sintering (DMLS) processes. SLM is capable of producing repeatable, complex-shaped internal passageways within a variety of metal 3D parts, such as for valve bodies (e.g., hydraulic manifolds), heat exchanger units, and the like.

SLM involves slicing a digital model of a desired 3D part into thin layers (e.g., less than about 100 micrometers in thickness). The sliced layers may then be processed for printing (e.g., support structure generation). During the printing operation, layers of powder metals are sequentially spread or otherwise distributed onto a substrate with a coating mechanism of an SLM system, preferably in an inert gas atmosphere (e.g., argon or nitrogen).

The SLM system then operates a computer-controlled laser emitter (e.g., with scanning mirrors) to selectively focus a laser beam onto each powder layer, with a tool path pattern defined by the sliced layers. The laser beam melts the powder to form solid metal welds for each layer. This process can then be repeated for each successive layer to print the metal 3D part, allowing a variety of complex geometries to be built, such as organically-shaped internal passageways.

In comparison, conventional manufacturing methods are not capable of producing such organically-shaped internal passageways. For example, most of today's manifold passageways have holes drilled in from the outside in straight lines intersecting with other drilled holes. Such intersections are known to generate pressure losses, which reduce the efficiency and performance of the manifold. In addition, after the drilling external holes, they need to be precision reamed and then plugged. Complex hydraulic manifolds for aerospace applications can have up to 100 holes drilled in them. Special tooling and fixtures are required along with complex machine setup to drill the holes.

Moreover, current SLM processes require support structures to maintain the locations and orientations of 3D printed geometries to reduce warpage and distortion during the layer additive processes. As can be appreciated, many organically-shaped internal passageways can have complex geometries that make it difficult, if not impossible, to remove the support structures from within the 3D parts. As such, metal 3D parts with these internal passageways cannot be efficiently manufactured.

Figure 1:
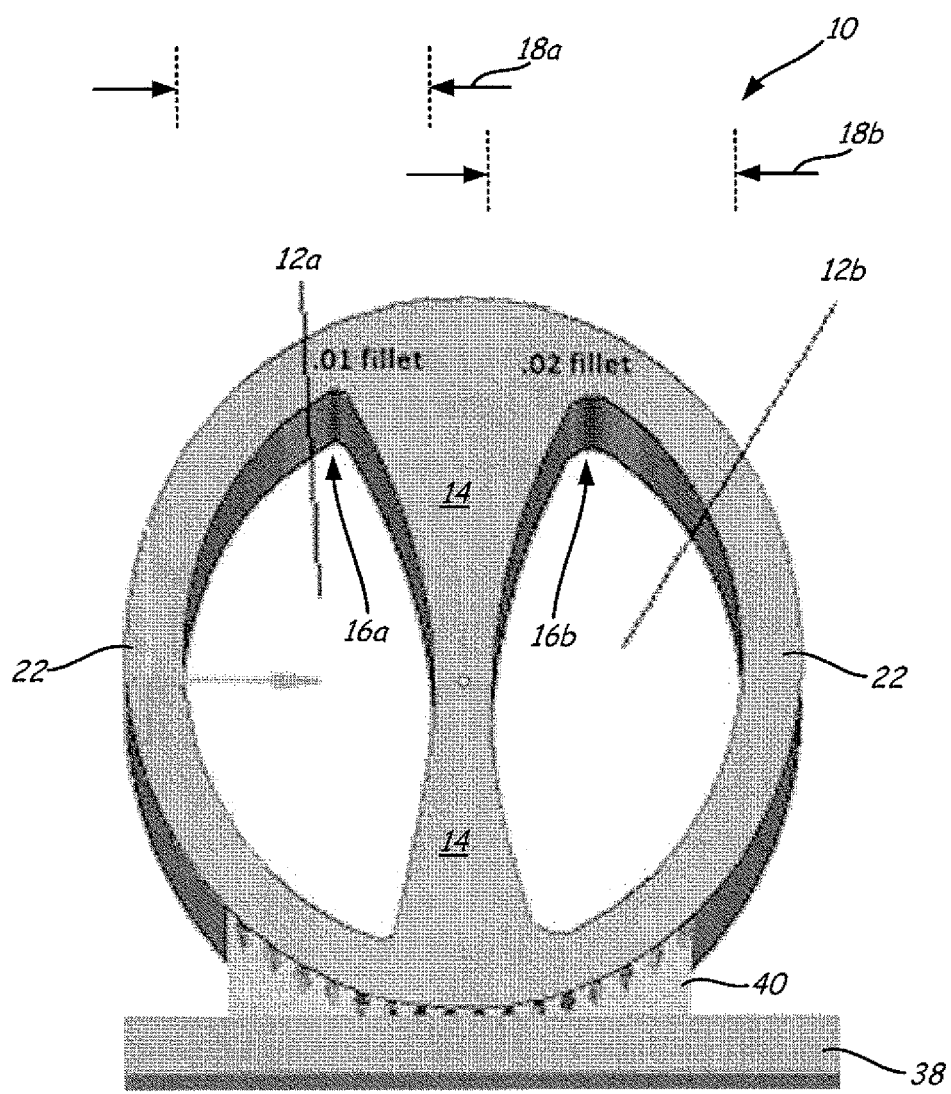
FIG. 1 is a front view of a 3D part of the present disclosure, which is built with a selective laser melting or direct metal laser sintering process.

The process of the present disclosure, however, is capable of producing metal 3D parts from a powder-based selective laser process (e.g., an SLM process and/or a DMLS process), where the 3D parts can have self-supporting internal passageways. These self-supporting internal passageways are particularly suitable for producing valve bodies (e.g., hydraulic manifolds), heat exchanger units, and the like. This is illustrated in FIG. 1, which shows an example 3D part 10 produced with an SLM process, and includes internal passageways 12*a* and 12*b* that are separated and supported by a tree structure rib 14. The view of 3D part 10 shown in FIG. 1 corresponds to an end view or cross-sectional view of 3D part 10, which can extend along the y-axis in an x-y-z Cartesian coordinate system, for example.

Alternatively, 3D part 10 can exhibit a complex geometry, where passageways 12*a* and 12*b*, and rib 14 may turn, bend, or otherwise change directions to preferably provide organically-shaped geometries. In any embodiment, passageways 12*a* and 12*b*, and rib 14 preferably maintain the same or substantially the same cross-sectional dimensions, or at least maintain the desired dimensional ranges discussed below to preclude the need for additional support structures.

As shown, rib 14 separates passageways 12*a* and 12*b* such that passageways 12*a* and 12*b* have tear-drop designs with downward-facing surfaces 16*a* and 16*b*. It has been found that the tear-drop designs can sufficiently support the geometries of passageway 12*a* and 12*b* when passageway 12*a* and 12*b* each fall within a certain range of dimensions. This precludes the need for separate support structures. Eliminating internal support structures promotes greater design freedom with the additional benefits of higher performance products with more efficient operation, and it reduces or possibly eliminates the post-build labor associated with support removal. Additionally, it can reduce build times by eliminating the process steps otherwise required to build the support structures.

Notably, it has been found that downward-facing surfaces 16*a* and 16*b* are each preferably held within a small window of dimensions. Preferably, surfaces 16*a* and 16*b* each have a fillet radius ranging from about 0.005 inches to about 0.04 inches, more preferably from about 0.01 inches to about 0.04 inches, and even more preferably from about 0.01 inches to about 0.03 inches. In the shown example, surface 16*a* has a fillet radius of about 0.01 inches, and surface 16*b* has a fillet radius of about 0.02 inches. It has been found that if the fillet radius for either surface 16*a* or 16*b* is to small (e.g., less than about 0.005 inches in some cases), the SLM process can burn the metal material at the apex intersection.

However, the dimensions of surfaces 16*a* and 16*b* alone are not sufficient to be self-supporting. Instead, it has been found that a combination of the dimensions of surfaces 16*a* and 16*b* and the lateral dimensions of passageways 12*a* and 12*b* provides the mechanism to render surfaces 16*a* and 16*b* self supporting (i.e., precludes the need for additional support structures).

In preferred embodiments, internal passageways 12*a* and 12*b* each independently has a maximum lateral spans along the x-axis, referred to as lateral spans 18*a* and 18*b*, of about 0.25 inches or less, and more preferably from about 0.15 inches to about 0.25 inches. In some further embodiments, lateral spans 18*a* and 18*b* each independently range from about 0.15 inches to about 0.20 inches. In other embodiments, lateral spans 18*a* and 18*b* each independently range from about 0.20 inches to about 0.25 inches. The term "maximum lateral span" refers to the largest hollow span along a lateral cross-sectional direction of the internal passageway, such as lateral spans 18a and 18b.

Internal passageways 12a and 12b with lateral spans 18a and 18b less than about 0.15 inches can be self-supporting and typically do not require additional support structures, regardless of their build orientations. However, their smaller dimensions result in lower cross-sectional areas for fluid flow. In fact, many small internal passageways, which do not require additional support structures, simply do not provide sufficient volumetric fluid flow for their intended purposes.

Figure 2:
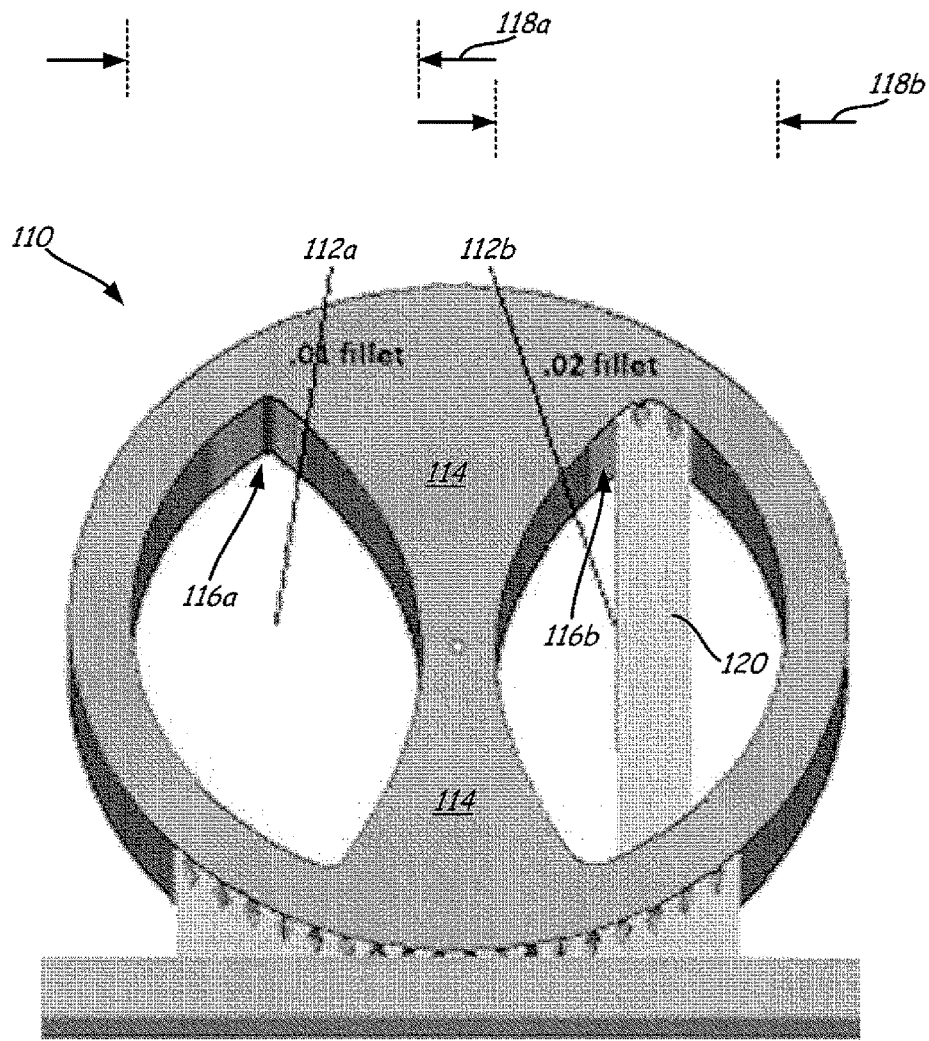
FIG. 2 is a front view of a comparative 3D part, which has an internal passageway that is not self-supporting.

Conversely, internal passageways 12a and 12b with lateral spans 18a and 18b greater than about 0.25 inches may require additional support structures along lengths of one or both of internal passageways 12a and 12b. For example, as shown in FIG. 2, a comparative 3D part 110 having internal passageways 112a and 112b with lateral spans 118a and 118b that are each greater than about 0.25 inches, will require an additional internal support structure 120 for surface 116b (having a fillet radius of about 0.02 inches), despite having a rib 114. As can be appreciated, this additional support structure 120 can be difficult to remove if the 3D part 110 has a complex internal geometry, such as found with many organically-shaped internal passageways.

Accordingly, the combination of (i) the above-discussed fillet radii for the tear-drop design with downward-facing surfaces 16a and 16b, and (ii) the lateral spans 18a and 18b of internal passageways 12a and 12b along the x-axis allows 3D part 10 to be printed without requiring any additional support structures. As such, in some preferred embodiments, surfaces 16a and 16b each independently has a fillet radius ranging from about 0.005 inches to about 0.04 inches, more preferably from about 0.01 inches to about 0.04 inches, and even more preferably from about 0.01 inches to about 0.03 inches. In these preferred embodiments, internal pathways 12a and 12b each independently has an inner diameter 18 of about 0.25 inches or less, and more preferably from about 0.15 inches to about 0.25 inches.

In addition to the difficulty of support removal, the dimensions of internal passageways 12a and 12b of 3D part 10 as shown in FIG. 1 provide larger cross-sectional areas for fluid flow compared to those of 3D part 110 shown in FIG. 2. This is despite the fact that 3D part 110 has larger lateral spans 118a and 118b (compared to lateral spans 18a and 18b of 3D part 10).

Furthermore, internal passageways 12a and 12b with the above-discussed dimensions also allow for cleaner holes without sharp corners, metal stalagmite formations, or substantial warpage. Moreover, the outer walls of 3D part 10 (referred to as walls 22, shown above in FIG. 1) and rib 14 provide sufficient thermal conduction pathways to draw heat away from the laser beam focal regions. This can further reduce the risk of burning and warpage, and can provide a cleaner finished part.

Figure 3:
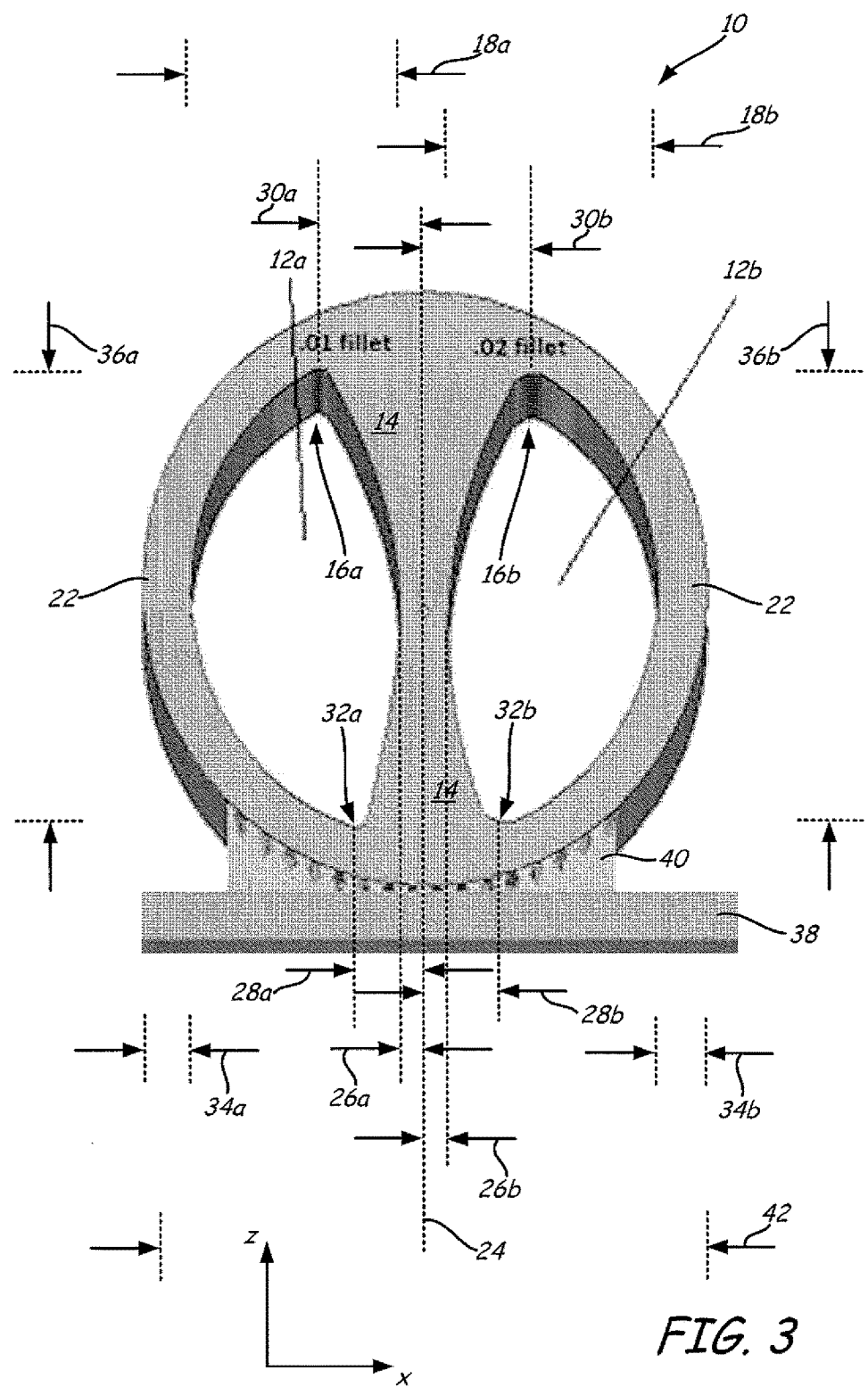
FIG. 3 is a front view of the 3D part shown in FIG. 1, further illustrating example dimensions for the 3D part.

As shown in FIG. 3, rib 14 and walls 22 of 3D part 10 also have preferred dimensions to define the dimensions of internal passageways 12a and 12b. For example, rib 14 may extend in each direction along the lateral x-axis from a bisecting line 24 with mid spans 26a and 26b, base spans 28a and 28b, and top spans 30a and 30b. Mid spans 26a and 26b are the smallest lateral spans for rib 14 from bisecting line 24, and may be located about midway between the top and bottom ends of rib 14. Example dimensions for mid spans 26a and 26b each independently range from about 0.01 inches to about 0.04 inches, and in some embodiments, from about 0.015 inches to about 0.03 inches.

Base span 28a extends from bisecting line 24 to upward-facing surface 32a of internal passageway 12a, and base span 28b extends from bisecting line 24 to upward-facing surface 32b of internal passageway 12b, as shown. Example dimensions for base spans 28a and 28b each independently range from about 0.03 inches to about 0.07 inches, and in some embodiments, from about 0.04 inches to about 0.06 inches. Correspondingly, upward-facing surfaces 32a and 32b may have suitable fillet radii to accommodate the dimensions of internal passageways 12a and 12b. Examples of suitable fillet radii for each of upward-facing surfaces 32a and 32b include those discussed above for downward-facing surfaces 16a and 16b. In some embodiments, surfaces 16a and 32a have substantially the same fillet radii, and/or surfaces 16b and 32b have substantially the same fillet radii.

Top span 30a extends from bisecting line 24 to downward-facing surface 16a of internal passageway 12a, and top span 30b extends from bisecting line 24 to downward-facing surface 16b of internal passageway 12b, as shown. In some preferred embodiments, top spans 30a and 30b are larger than bottom spans 28a and 28b, which is believed to assist the self-supporting, tear-drop designs for internal passageways 12a and 12b. Example dimensions for top spans 30a and 30b each independently range from about 0.05 inches to about 0.1 inches, and in some embodiments, from about 0.06 inches to about 0.09 inches.

Walls 22 may have any suitable wall thickness, referred to as wall thicknesses 34a and 34b on the opposing lateral sides of internal passageways 12a and 12b, to assist in defining the dimensions of internal passageways 12a and 12b, and for thermal conduction purposes. Example dimensions for wall thicknesses 34a and 34b each independently range from about 0.02 inches to about 0.8 inches, and in some embodiments, from about 0.03 inches to about 0.06 inches.

Internal passageways 12a and 12b may also have any suitable height along the z-axis, referred to as heights 36a and 36b, which are respectively taken from the maximum distances between surfaces 16a and 32a, and between surfaces 16b and 32b. Suitable dimensions for heights 36a and 36b may vary depending on the particular dimensions of 3D part 10. For instance, in embodiments in which 3D part 10 is cylindrical or substantially cylindrical, heights 36a and 36b may be selected to achieve suitable dimensions corresponding to the combinations of lateral spans 18a and 18b, and mid spans 26a and 26b. Example dimensions for heights 36a and 36b each independently range from about 0.3 inches to about 0.8 inches, and in some embodiments, from about 0.4 inches to about 0.7 inches.

In other embodiments, 3D part 10 may include three or more internal passageways having dimensions corresponding to those of internal passageways 12a and 12b, and which can be offset laterally from each other along the x-axis by two or more ribs 14. In these embodiments, the outer or lateral-most internal passageways may each be defined by a wall 22 and a rib 14 (similar to internal passageways 12a and 12b), and the interior-most internal passageways may each be defined by a pair of laterally-opposing ribs 14. For example, in an embodiment in which 3D part 10 includes three internal passageways, the first and second internal passageways may be separated from each other by a first rib 14, and the second and third internal passageways may be separated from each other by a second rib 14. In this case, the center internal passageway has a tear-drop design with a downward-facing surface defined by the first and second ribs 14.

Accordingly, 3D part 10 may include any suitable number of self-supporting internal passageways, each preferably having a tear-drop design with a downward-facing surface. Examples of suitable numbers of internal passageways for 3D part 10 range from one to ten, from two to eight, two to six, and/or from two to four.

As also shown in FIGS. 1 and 3, 3D part 10 may be built in a layer-by-layer manner with the SLM system (or DMLS system) on substrate 38 with the use of a base support structure 40. In comparison to the internal support structure 120 for 3D part 110 (shown in FIG. 2), base support structure 40 is located outside of 3D part 10, allowing it to be readily removed after the build operation is completed.

In further applications, the dimensions of rib 14, such as the dimensions of one or more of mid spans 26a and 26b, base spans 28a and 28b, and top spans 30a and 30b, may vary along the length of rib 14. In some embodiments, the overall inner dimensions of 3D part 10 (e.g., outer diameter 42, shown in FIG. 3) can increase or decrease with the dimensional variations of rib 14 to substantially keep the cross-sectional areas of internal passageways 12a and 12b substantially constant over the length of 3D part 10 (or at least a portion of its length). Moreover, in some additional embodiments, rib 14 may include one or more intermittent gaps or holes along its length to interconnect the adjacent internal passageways 12a and 12b.

Figure 4:
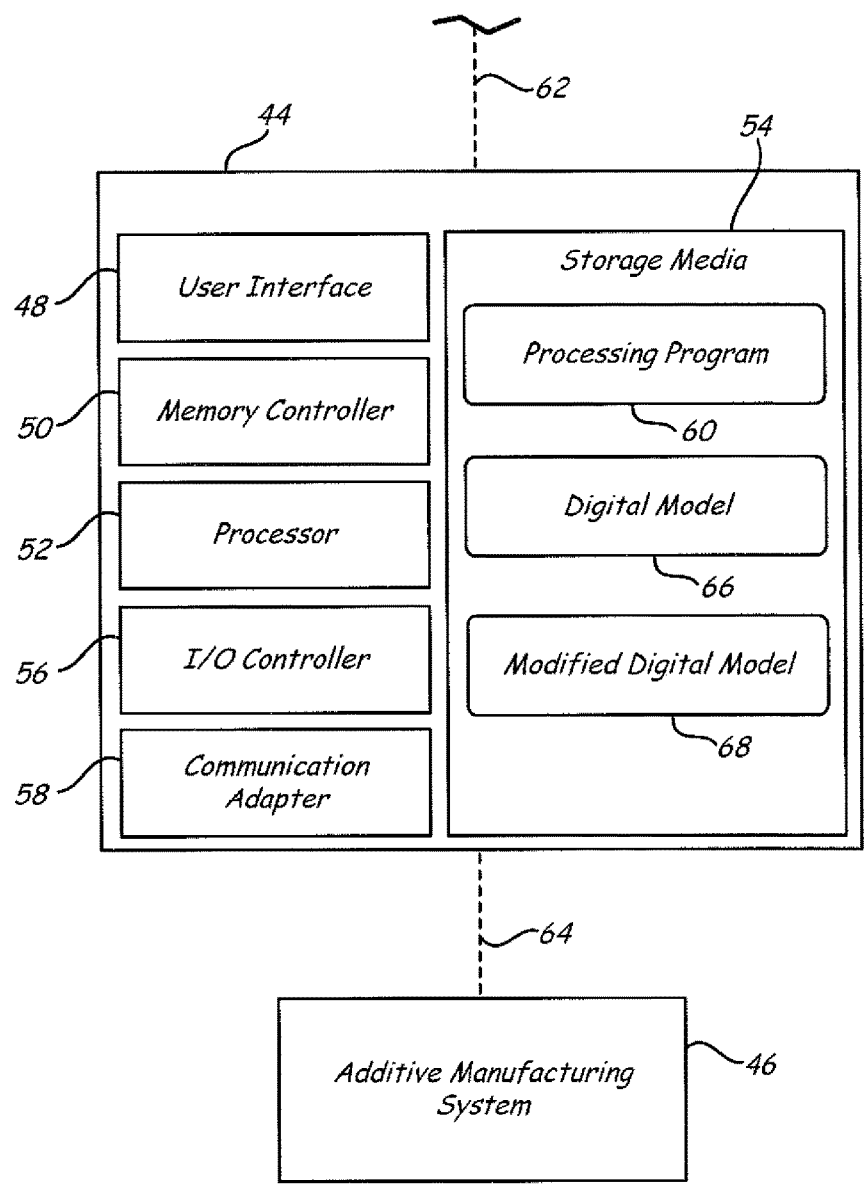
FIG. 4 illustrates an example architecture for computer in use with one or more additive manufacturing systems.

3D parts having the self-supporting interior passageways, such as 3D part 10, can be produced from digital models (e.g., STL data files) that are pre-designed with the interior passageways and/or the interior passageways can be post-processed into the digital models with a computer prior to slicing. For example, FIG. 4 illustrates an example architecture for computer 44 in use with one or more additive manufacturing systems 46 (e.g., SLM and/or DMLS systems).

As shown, computer 44 may include any suitable computer-based hardware, such as user interface 48, memory controller 50, processor 52, storage media 54, input/output (I/O) controller 56, and communication adapter 58. Computer 44 may also include a variety of additional components that are contained in conventional computers, servers, media devices, signal processing devices, and/or printer controllers.

User interface 48 is one or more user-operated interfaces (e.g., keyboards, touch pads, touch-screen displays, display monitors, and other eye, voice, movement, or hand-operated controls) configured to operate computer 44. Memory controller 50 is one or more circuit assemblies that interface the components of computer 44 with one or more volatile random access memory (RAM) modules of storage media 54. Processor 52 is one or more computer-processing units configured to operate computer 44, optionally with memory controller 50, and preferably with related processing circuitry (e.g., programmable gate arrays, digital and analog components, and the like). For instance, processor 52 may include one or more microprocessor-based and/or microcontroller-based units, one or more central processing units, and/or one or more front-end processing units.

Storage media 54 is one or more internal and/or external data storage devices or computer storage media for computer 44, such as volatile RAM modules, read-only memory modules, optical media, magnetic media (e.g., hard disc drives), solid-state media (e.g., FLASH memory and solid-state drives), analog media, and the like. Storage media 54 may retain one or more pre-processing and/or post-processing programs 60 for generating the interior passageways into digital models, for slicing the digital models, and for generating tool path instructions for printing the 3D parts and support structures.

I/O controller 56 is one or more circuit assemblies that interface memory controller 50, processor 52, and storage media 54 with various input and output components of computer 44, including user interface 48 and communication adapter 58. Communication adapter 58 is one or more wired and/or wireless transmitter/receiver adapters configured to optionally communicate with one or more external computers (not shown) over one or more communication lines 62, and to communicate with additive manufacturing system(s) 46 over one or more communication lines 64. The commands from computer 44 to the components of systems 46 may be performed with one or more of user interface 48, memory controller 50, processor 52, storage media 54, input/output (I/O) controller 56, communication adapter 58, and/or other suitable hardware and software implementations, as is understood by those skilled in the art.

During use, storage media 54 may receive and retain one or more data files of digital models to be printed with system(s) 46, such as digital model 66. Computer 44 may then use processing program 60 to generate one or more self-supporting internal passageways into the digital model 66, as discussed above for 3D part 10 (shown in FIGS. 1 and 3). In some embodiments, the self-supporting internal passageways may be generated in solid regions of the digital model 66 such that the digital model 66 then becomes partly hollow. Alternatively, digital model 66 may include pre-defined internal passageways that are not self-supporting, and computer 44 can then modify the dimensions of the pre-defined internal passageways to produce the self-supporting internal passageways. In either case, processing program 60 can modify the interior surface dimensions of digital model 66 to define a rib structure (e.g., rib 14) and one or more self-supporting internal passageways.

Computer 44 may then optionally save the resulting modified digital model as digital model 68 (e.g., as a separate STL file or rewrite of digital model 66) on storage media 54. Computer 44 may then use processing program 60 to slice digital model 68 into sliced layers, generate tool paths for each sliced layer (and optionally for any support structures), and transmit the resulting tool path instructions to a system 46 to print a 3D part having the self-supporting internal passageways. As discussed above for 3D part 10, each self-supporting internal passageway preferably has a tear-drop design with a downward-facing surface as described above for internal passageways 12a and 12b, and in embodiments in which the 3D part has two or more self-supporting internal passageways, the adjacent passageways are preferably separated by a rib structure as described above for rib 14.

Although the present disclosure has been described with reference to preferred embodiments, workers skilled in the art will recognize that changes may be made in form and detail without departing from the spirit and scope of the disclosure.

The invention claimed is:

1. A method for producing a three-dimensional printed part using a metal powder-based additive manufacturing system, the method comprising:
   receiving to a computer a digital model of a three-dimensional part having one or more internal passageways;
   identifying internal passageways having lateral spans greater than 0.15 inches;
   modifying identified internal passageways having lateral spans greater than 0.15 inches to have a downward-facing surfaces that separate the at least one passageway into first and second secondary passageways, wherein each downwardly facing surfaces have a fillet radius ranging from 0.005 inches to 0.04 inches;

slicing the modified digital model having the first and second secondary passageways into a plurality of sliced layers;

generating tool paths from the sliced layers for producing the three-dimensional printed part using the powder-based selective metal process; and outputting the sliced layers with the generated tool paths of the modified three-dimensional model to a 3D printer that utilizes the powder-based selective metal process.

2. The method of claim 1, wherein the first and second secondary passageways each have a tear-drop design with the downward-facing surface.

3. The method of claim 1, and further comprising generating one or more additional support structures for the digital model, wherein the one or more internal passageways are each free of the one or more additional support structures.

4. The method of claim 1, wherein the modifying the at least one passageway of the one or more internal passageways having the lateral span of at least 0.15 inches to have a downward-facing surface that separates the at least one passageway into the first and second smaller passageways comprises:

generating a tree structure rib within the at least one passageway having the lateral span of at least 0.15 inches, wherein the tree structure rib extends in each lateral direction from a bisecting line, and wherein the tree structure rib comprises:

a mid span from the bisecting line ranging from 0.01 inches to 0.04 inches;

a base span from the bisecting line ranging from 0.03 inches to 0.07 inches; and a top span from the bisecting line ranging from 0.05 inches to 0.1 inches.

5. The method of claim 1, and further comprising utilizing the outputted sliced layers with the generated tool paths of the modified 3D part to produce the three-dimensional printed part using the powder-based selective metal process in the additive manufacturing system.

6. The method of claim 1, wherein each downwardly facing surface has a fillet radius ranging from 0.01 inches to 0.04 inches.

7. The method of claim 1, wherein each downwardly facing surface has a fillet radius ranging from 0.01 inches to 0.03 inches.

8. The method of claim 1, where each of the first and second secondary passageways has a maximum lateral span ranging between about 0.15 inches and 0.25 inches.

9. The method of claim 1, where each of the first and second secondary passageways has a maximum lateral span ranging between about 0.15 inches and 0.20 inches.

10. The method of claim 1, where each of the first and second secondary passageways has a maximum lateral span ranging between about 0.20 inches and 0.25 inches.

* * * * *